(12) United States Patent
Weber et al.

(10) Patent No.: US 8,836,053 B2
(45) Date of Patent: Sep. 16, 2014

(54) HYBRID INTEGRATED COMPONENT AND METHOD FOR THE MANUFACTURE THEREOF

(71) Applicants: Heribert Weber, Nuertingen (DE); Frank Fischer, Gomaringen (DE); Mirko Hattass, Stuttgart (DE); Yvonne Bergmann, Reutlingen (DE)

(72) Inventors: Heribert Weber, Nuertingen (DE); Frank Fischer, Gomaringen (DE); Mirko Hattass, Stuttgart (DE); Yvonne Bergmann, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 13/890,450

(22) Filed: May 9, 2013

(65) Prior Publication Data

US 2013/0299924 A1     Nov. 14, 2013

(30) Foreign Application Priority Data

May 14, 2012 (DE) .......................... 10 2012 208 033

(51) Int. Cl.
*H01L 29/84* (2006.01)
*B81B 3/00* (2006.01)
*B81C 1/00* (2006.01)

(52) U.S. Cl.
CPC ........... *B81B 3/0021* (2013.01); *B81C 1/00261* (2013.01)
USPC ........... 257/415; 257/417; 257/418; 257/253; 257/254

(58) Field of Classification Search
USPC .......................... 257/415, 417, 418, 253, 254
See application file for complete search history.

(56) References Cited

FOREIGN PATENT DOCUMENTS

EP      0 773 443      5/1997

*Primary Examiner* — Timor Karimy
(74) *Attorney, Agent, or Firm* — Kenyon & Kenyon LLP

(57) ABSTRACT

A component system includes at least one MEMS element, a cap for a micromechanical structure of the MEMS element, and at least one ASIC substrate. The micromechanical structure of the MEMS element is implemented in the functional layer of an SOI wafer. The MEMS element is mounted face down, with the structured functional layer on the ASIC substrate, and the cap is implemented in the substrate of the SOI wafer. The ASIC substrate includes a starting substrate provided with a layered structure on both sides. At least one circuit level is implemented in each case both in the MEMS-side layered structure and in the rear-side layered structure of the ASIC substrate. In the ASIC substrate, at least one ASIC through contact is implemented which electrically contacts at least one circuit level of the rear-side layered structure and/or at least one circuit level of the MEMS-side layered structure.

7 Claims, 8 Drawing Sheets

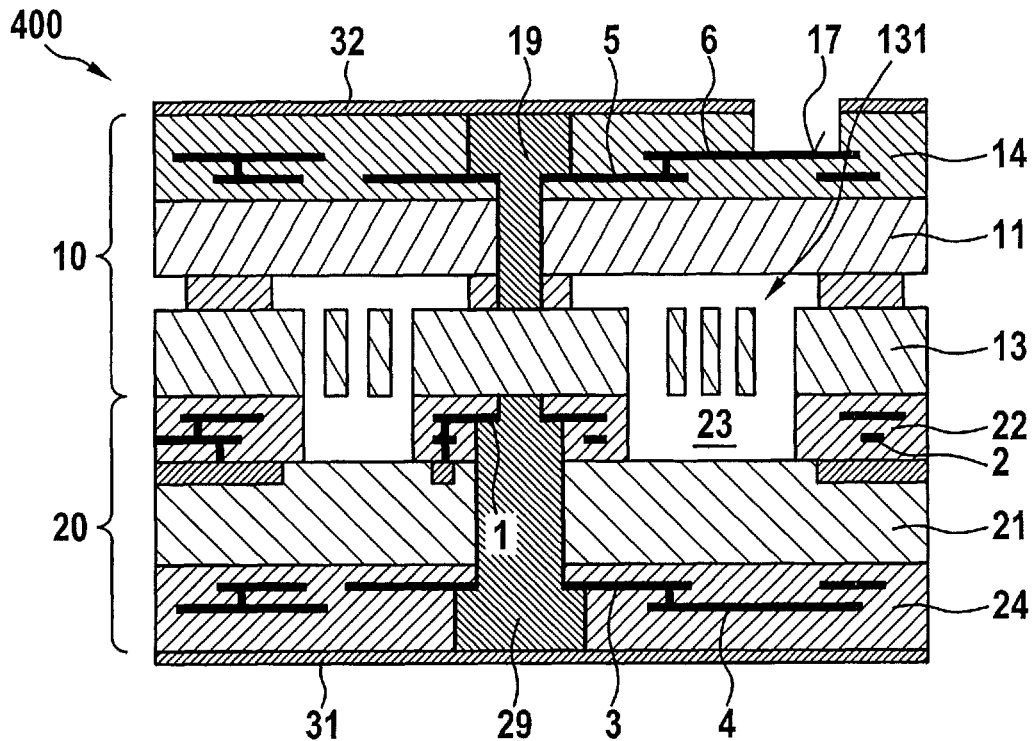
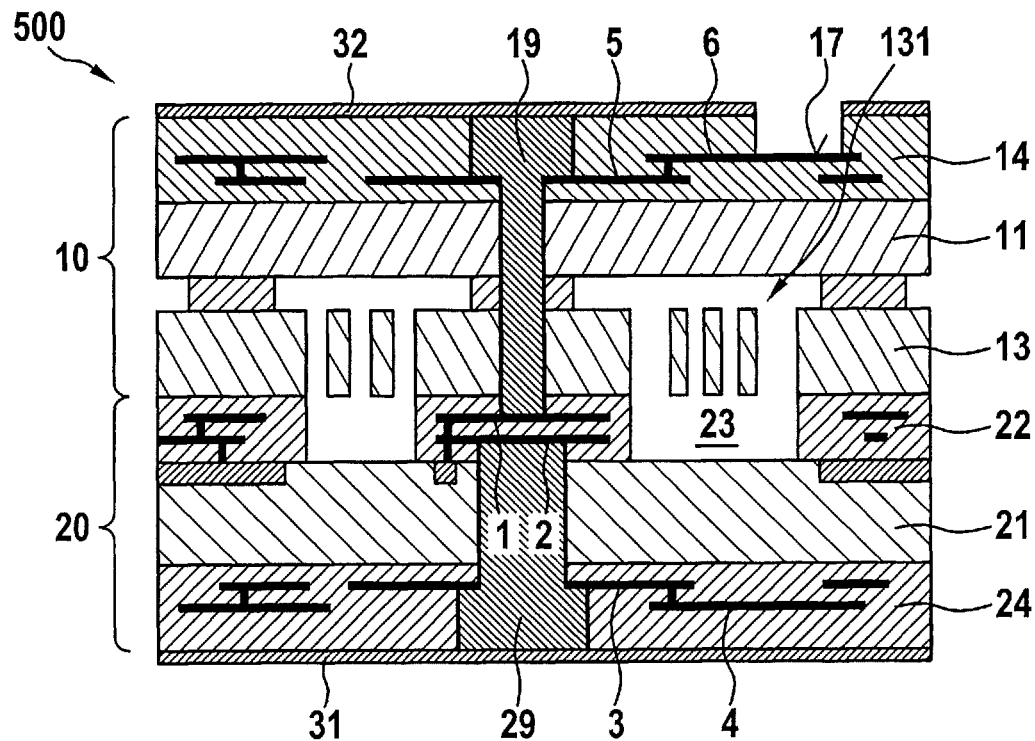

HYBRID INTEGRATED COMPONENT AND METHOD FOR THE MANUFACTURE THEREOF

BACKGROUND OF THE INVENTION

1. Field of the Invention

The present invention relates to a component including at least one MEMS (micro-electromechanical system) element, a cap for the micromechanical structure of the MEMS element, and at least one ASIC (application specific integrated circuit) substrate. The micromechanical structure of the MEMS element is implemented in the functional layer of an SOI (silicon on insulator) wafer, the MEMS element is mounted face down, with the structured functional layer on the ASIC substrate, and the cap is implemented in the substrate of the SOI wafer. Furthermore, the present invention relates to a method for manufacturing such a hybrid integrated component.

2. Description of the Related Art

The starting point of the present invention is a component as is known from published European Patent Specification 0 773 443. In this publication, a micromechanical acceleration sensor is described, which is implemented in the form of a chip stack, including an ASIC substrate and an MEMS substrate. An SOI wafer, in the functional layer of which a rocker-shaped sensor structure is implemented, functions as the MEMS substrate. The MEMS substrate is mounted using flip-chip technology on the ASIC substrate, so that the sensor structure is located in a hermetically sealed cavity between the ASIC surface and the rear-side substrate of the SOI wafer.

Accelerations cause a deflection of the rocker structure, which is detected capacitively here with the aid of measuring electrodes on the sensor structure and stationary electrodes on the ASIC surface. In the case of the known acceleration sensor, the evaluation circuit for the measuring signals is additionally located on the ASIC substrate.

BRIEF SUMMARY OF THE INVENTION

The present invention provides a simple and cost-effective concept for the external electrical contacting of such components, which allows an expansion of the circuit-related functionality of these components.

For this purpose, the starting substrate of the ASIC substrate is provided according to the present invention with a layered structure on both sides, at least one circuit level being implemented in each case both in the MEMS-side layered structure and also in the rear-side layered structure of the ASIC substrate. For the external contacting, at least one ASIC through contact is implemented in the ASIC substrate, which, starting from the rear side of the component, electrically contacts at least one circuit level of the rear-side layered structure and/or at least one circuit level of the MEMS-side layered structure.

Both the MEMS-side layered structure and also the rear-side layered structure advantageously include a multilayered metallization, that is, multiple circuit levels. A very high degree of design freedom thus exists in the electrical wiring of the individual circuit parts of the component. The ASIC through contact is conceived according to the present invention in such a way that it allows targeted contacting of individual circuit levels of both the MEMS-side layered structure and also the rear-side layered structure. In addition, the ASIC through contact allows direct mounting of the component according to the present invention, in the case of which the component is both mechanically fixed and also electrically contacted in one mounting step.

To manufacture such a hybrid integrated component, initially an SOI wafer functioning as an MEMS substrate is processed. The functional layer of the SOI wafer is structured in order to produce and expose the micromechanical structure of the MEMS element. Independently thereof, an ASIC substrate is preprocessed. On a starting substrate, a first layered structure is produced, which includes at least one structured metal layer as a circuit level, which is embedded in at least one insulating layer. The structured MEMS substrate is then mounted face down, with the structured functional layer on the first layered structure of the preprocessed ASIC substrate, in such a way that the rear-side substrate of the SOI wafer is used as a cap for the micromechanical structure of the MEMS element. According to the present invention, a second layered structure, which also includes at least one structured metal layer as a circuit level, is produced on the rear side of the ASIC substrate. The circuit levels of this rear-side layered structure are also embedded in an insulating layer. Finally, originating from the rear side of the ASIC substrate, at least one ASIC through contact is produced which electrically contacts at least one circuit level of the rear-side layered structure and/or at least one circuit level of the MEMS-side layered structure.

In one advantageous refinement of the present invention, the component is also provided on the cap side with a layered structure, which includes at least one further circuit level. The circuit levels of the cap-side layered structure are also preferably implemented in the form of structured metal layers, which are embedded in at least one insulating layer. In addition, at least one MEMS through contact is also implemented in the MEMS element, this MEMS through contact originating from the upper side of the component and extending at least up to a circuit level of the cap-side layered structure, in order to establish an electrical connection to the circuit level.

In the case of this embodiment variant of the component according to the present invention, circuit elements may also be integrated into the rear-side substrate of the SOI wafer, i.e., into the cap. These circuit elements may then be interconnected via the circuit levels in the cap-side layered structure and may be contacted via the MEMS through contact. In addition, the MEMS through contact allows flip-chip mounting of the component, in which the component is both mechanically fixed and also electrically contacted via the cap.

Depending on how the wiring between the individual circuit levels of the component is conceived, the electrical connection of the micromechanical structure of the MEMS element may be implemented as contactless or by connection to a circuit level or also with the aid of a through contact, which may be implemented in the ASIC element or in the MEMS element and which extends up to the functional layer of the MEMS element.

The ASIC and MEMS through contacts may each also extend up to and beyond the functional layer of the MEMS element, however, if this is reasonable with regard to the circuitry functions of the component. In this way, through contacts, which extend over the entire thickness of a component according to the present invention, may also be implemented. For this purpose, an MEMS through contact, which opens into this ASIC through contact, is applied aligned with an ASIC through contact, so that the MEMS through contact and the ASIC through contact merge into one another.

Targeted contacting of the individual circuit levels of the component according to the present invention may be achieved particularly well with the aid of through contacts in stepped shape, if the step surfaces of such a through contact each terminate with the circuit level to be contacted of the component. In this way, a planar electrical contact is thus produced between the through contact and the circuit level.

Through contacts are typically manufactured in an ASIC substrate or also in an MEMS substrate, in that initially a corresponding through contact opening is produced in this substrate, in order to then fill this opening with an electrically conductive material. The location and opening cross section of the through contact opening are determined by a masking of the substrate surface. Also in the case of manufacturing of a through contact in stepped shape, a through contact opening is produced in the substrate, the opening of which is superficially defined by a masking of the substrate surface. The stepped shape of the through contact opening is produced according to the present invention with the aid of at least one structured metal layer, which forms an etch stop boundary within the layered structure. For this purpose, the corresponding openings in the superficial masking and in this at least one structured metal layer are implemented and/or arranged in such a way that they are aligned, but are not congruent. In this way, both the location and also the lateral extension of steps in a through contact opening may be easily defined. An anisotropic plasma etching process is preferably used as a structuring process for manufacturing the through contact openings, while an anisotropic oxide etching process is used in the case of oxide and an anisotropic trenching process is used in the case of silicon. On the one hand, the metal layers of the circuit levels are only insignificantly attacked by this etching process, if at all, and therefore form a reliable etch stop boundary for this etching process. On the other hand, passage openings having a very high aspect ratio may be produced using anisotropic plasma etching processes, which is advantageous with regard to the implementation of components having the smallest possible chip area. The stepped through contact openings may then be filled with a conductive material, for example, in an inkjet process, a dispensing process, a screen-printing process, a CVD (chemical vapor deposition) process, or using an electroplating process. Sequential applications of the mentioned processes for filling through contact openings are also conceivable.

The concept according to the present invention is suitable in particular for the electrical contacting of hybrid integrated sensor components which operate in a contactless manner, for example, inertial sensor components, since the sensor structure is hermetically sealed between the ASIC substrate and cap here and is thus protected from soiling and an aggressive measuring environment. In the case of an inertial sensor component, the micromechanical structure of the MEMS element includes at least one seismic mass and is equipped with circuit means for detecting the deflections of the seismic mass. The MEMS element is usually mounted above a standoff structure on the ASIC substrate here, in order to ensure mobility of the seismic mass. The evaluation circuit for the sensor signals is advantageously integrated into the ASIC substrate and/or into the circuit levels of the MEMS element.

BRIEF DESCRIPTION OF THE DRAWINGS

FIGS. 4 through 6 show contacting variants on the basis of schematic sectional views through three sensor components 400, 500, and 600 according to the present invention.

DETAILED DESCRIPTION OF THE INVENTION

Figure 1A:
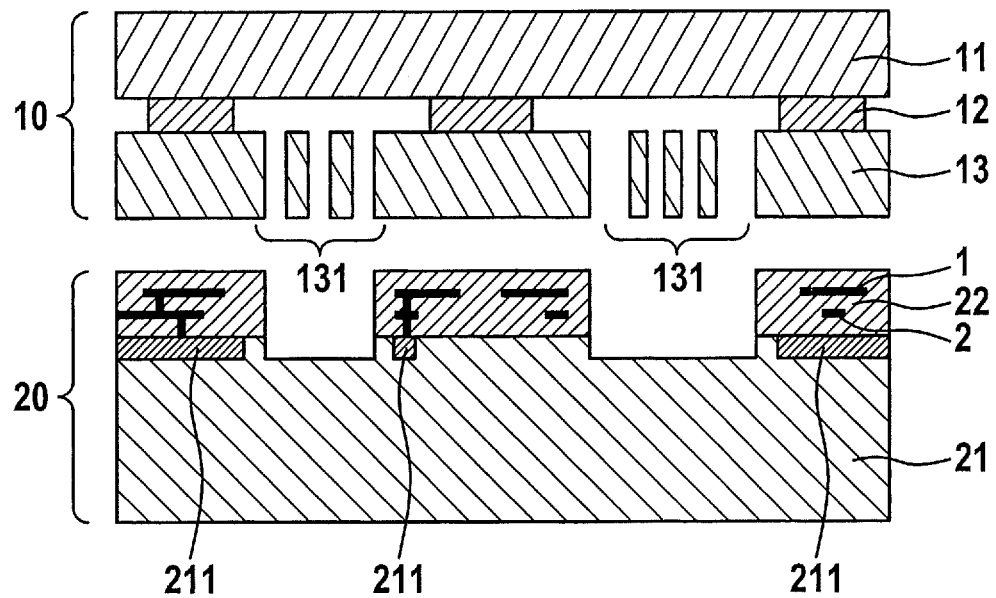
FIGS. 1a through 1f show the concept according to the present invention on the basis of schematic sectional views through the structure of a first sensor component 100 during the manufacture.

The manufacture of a hybrid integrated component 100 (FIG. 1f) according to the present invention will be explained hereafter on the basis of FIGS. 1a through 1f. This method is directed to two substrates, which are initially processed independently of one another.

One substrate, which is referred to hereafter as MEMS substrate 10, is an SOI wafer, including a rear-side substrate 11, an oxide layer 12, and a silicon functional layer 13. Within the scope of the preprocessing of MEMS substrate 10, silicon functional layer 13 is structured to produce a micromechanical structure. In the exemplary embodiment described here, a sensor structure 131 was produced and exposed, by removing oxide layer 12 in the area below sensor structure 131. Remaining rear-side substrate 11 functions as cap 11 for micromechanical structure 131 in functional layer 13. Since component 100 according to the present invention is manufactured in the wafer composite and the separation only takes place following the manufacturing method described hereafter, the terms "MEMS substrate" and "MEMS element" are used as synonyms here.

The other substrate is an ASIC substrate 20, into starting substrate 21 of which electrical circuit elements 211 are integrated. These are advantageously at least parts of a signal processing and evaluation circuit for the MEMS sensor function of component 100. In addition, however, MEMS-independent circuit functions may also be implemented. The CMOS processing of ASIC substrate 20 will not be described in detail here, since it is not specified in greater detail by the present invention. Starting substrate 21 is then provided with a multilayer metallization. For this purpose, a layered structure, which includes multiple structured metal layers 1, 2 as circuit levels, is produced on starting substrate 21. These circuit levels are connected to one another and/or to electrical circuit elements 211 by connecting lines, but are otherwise spatially and electrically separated from one another and from starting substrate 21 by insulating layers. Since the insulating layers are each an oxide layer in the exemplary embodiment described here, a differentiation is not made hereafter between the individual insulating layers. Rather, together these form an insulating layer 22, in which circuit levels 1, 2 are embedded. In the exemplary embodiment described here, insulating layer 22 is structured, i.e., provided with depressions, for the mounting of MEMS substrate 10.

FIG. 1a shows MEMS substrate 10 before the mounting on ASIC substrate 20 and illustrates that MEMS substrate 10 is mounted face down, that is with structured functional layer 13, on structured insulating layer 22 of ASIC substrate 20. Micromechanical sensor structure 131 is situated above the depression(s) in insulating layer 22, so that a certain vertical mobility of sensor structure 131 is ensured.

Figure 1B:
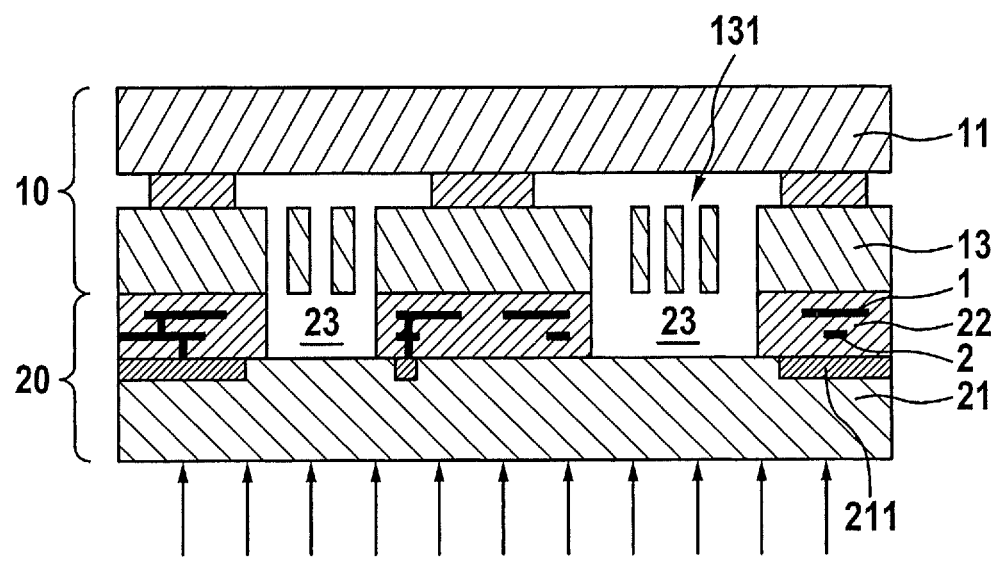

The connection between MEMS substrate 10 and ASIC substrate 20 is preferably established in a bonding process, for example, by fusion bonding or eutectic bonding using aluminum and germanium. On the one hand, such connections are very stable and therefore durable. On the other hand, micromechanical structure 131 may therefore be easily closed in a hermetically sealed manner in resulting cavity 23 between ASIC substrate 20 and cap or rear-side substrate 11 of SOI wafer 10. This situation is illustrated in FIG. 1b. The arrows on the rear side of ASIC substrate 20 show that ASIC substrate 20 is thinned after the assembly of MEMS substrate 10, for example, by chemical-mechanical polishing or plasma etching. The extent to which ASIC substrate 20 is thinned is essentially dependent on the type of the newer structure and connection technology. The remaining thickness of ASIC substrate 20 is to be selected in such a way that the mechanical stability of component 100 during its second level assembly is ensured.

Figure 1C:
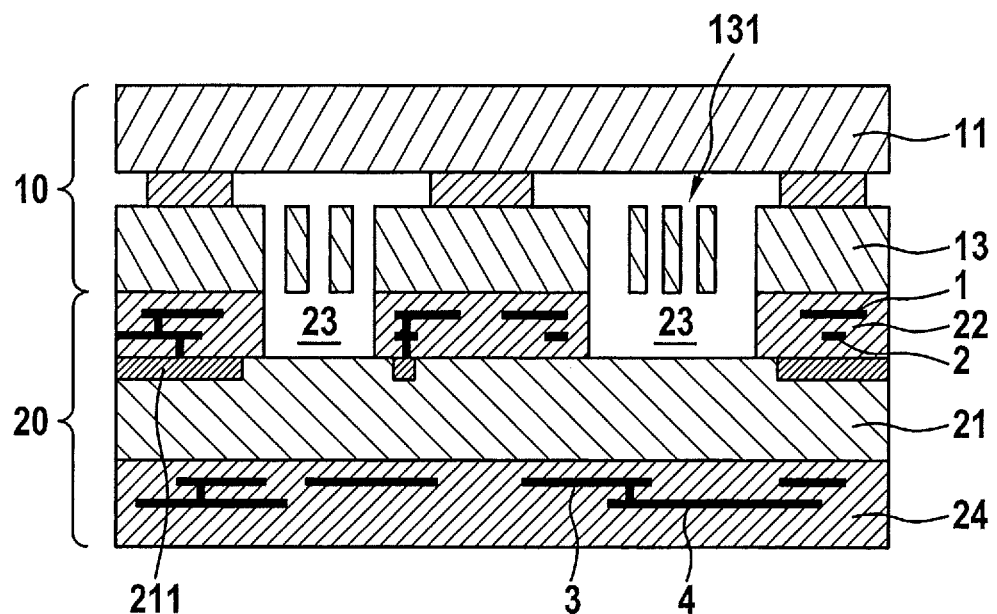

According to the manufacturing method according to the present invention, a layered structure having a multilayered metallization, which includes multiple structured metal layers 3, 4 as circuit levels embedded in an insulating layer 24, is now also produced on the rear side of ASIC substrate 20. FIG. 1c illustrates that areas of structured metal layers 3, 4 are also interconnected via connecting lines in the case of the rear-side layered structure.

Figure 1D:
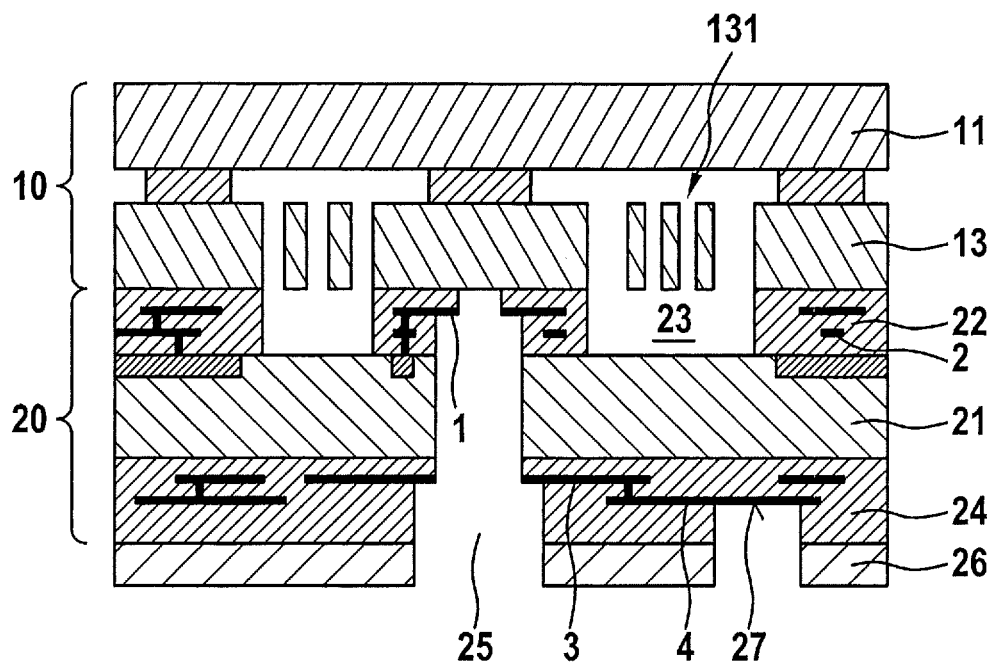

For the external electrical contacting of a component 100 thus manufactured, ASIC through contacts are now produced, which originate from the rear side of ASIC substrate 20, i.e., from the rear-side layered structure of ASIC substrate 20. For this purpose, initially through contact openings 25 are produced in ASIC substrate 20. Anisotropic plasma etching processes for etching insulating layers 24 and 22 and trenching processes for etching starting substrate 21 are primarily used. The position and opening cross section of through contact openings 25 are defined with the aid of a masking 26 of the rear side of ASIC substrate 20. FIG. 1d shows that structured metal layers 1, 2 and 3, 4 also act as an etch stop and thus protect the lower-lying layers of ASIC substrate 20 from an etching attack. The relative location, size, and geometry of the openings in masking 26 and in structured metal layers 1, 2 and 3, 4 define the shape of through contact openings 25. Due to the offset between these openings, through contact opening 25 shown in FIG. 1d has a stepped shape which is symmetrical to its central axis. The areas of structured metal layers 1 and 3 which are used as the etch stop boundary or masking and are exposed after the structuring form ring-shaped contact areas here. Through contact opening 25 extends in the case of component 100 over the entire thickness of ASIC substrate 20 up to functional layer 13 of MEMS substrate 10. To achieve this depth extension of through contact opening 25, an oxide etching process for structuring insulating layer 22 was selected as the last processing step in the exemplary embodiment described here, this process having the highest possible selectivity in relation to the strongly-doped silicon of functional layer 13. Functional layer 13 is thus used here as the etch stop boundary for this structuring process. For the sake of completeness, it is to be noted here that before the structuring of insulating layer 22, it was used as the etch stop layer for the silicon trenching process. Together with through contact opening 25 shown in FIG. 1d, an access opening to lowermost circuit level 4 was also produced here, which is also used in this case as an etch stop for the structuring process. Circuit level 4 in the area of this access opening is to be used here as a bond pad area 27 for component 100. However, it is also conceivable to implement the access opening to lowermost circuit level 4 later in the manufacturing process, for example, after the filling or planarization of through contact opening 25. Accordingly, with the aid of a suitable and congruent layout of masking 26 and structured metal layers 1, 2 and 3, 4 of the individual circuit levels and also by a suitable selection of the structuring processes, not only may stepped through contact openings 25 be produced, but rather bond pad areas 27 may also be opened at the same time.

Figure 1E:
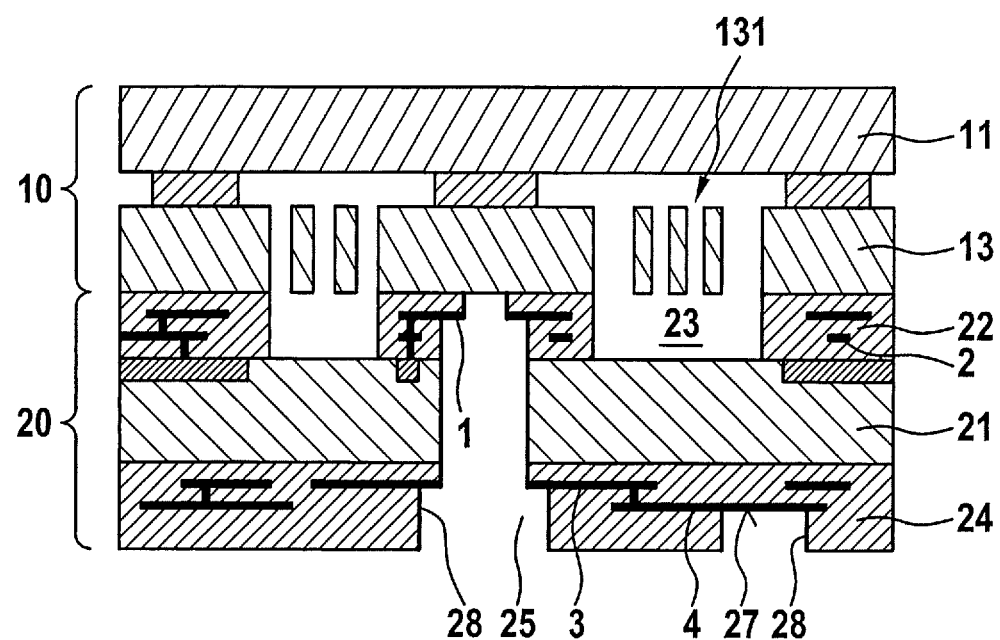

After the above-described structuring process, an electric passivation layer 28, for example, silicon dioxide, is deposited on the rear side of ASIC substrate 20, and in a surface-conforming manner, so that not only the surface areas parallel to the layer levels, but rather also the vertically oriented wall areas of through contact openings 25 and bond pad openings 27 are coated. This passivation layer 28 is then removed again in a following anisotropic plasma etching process only from the surface areas oriented in parallel to the layer levels, in order to expose the contact areas on structured metal layers 1, 3, and 4 and on functional layer 13. Passivation layer 28 remains on the other wall areas of through contact opening 25 and the access opening to circuit level 4 and forms a lateral electrical insulation for the particular through contact. This situation is shown in FIG. 1e.

To finish an ASIC through contact 29, through contact opening 25 thus coated is finally also filled with an electrically conductive material. Bond pad opening 27 is protected with a mask for this purpose. Due to the stepped shape of through contact opening 25 and the exposed contact areas on metal layers 1 and 3, ASIC through contact 29 forms an electrical connection between functional layer 13, circuit level 1 of the MEMS-side layered structure, circuit level 3 of the rear-side layered structure, and the rear side of ASIC substrate 20.

Figure 1F:
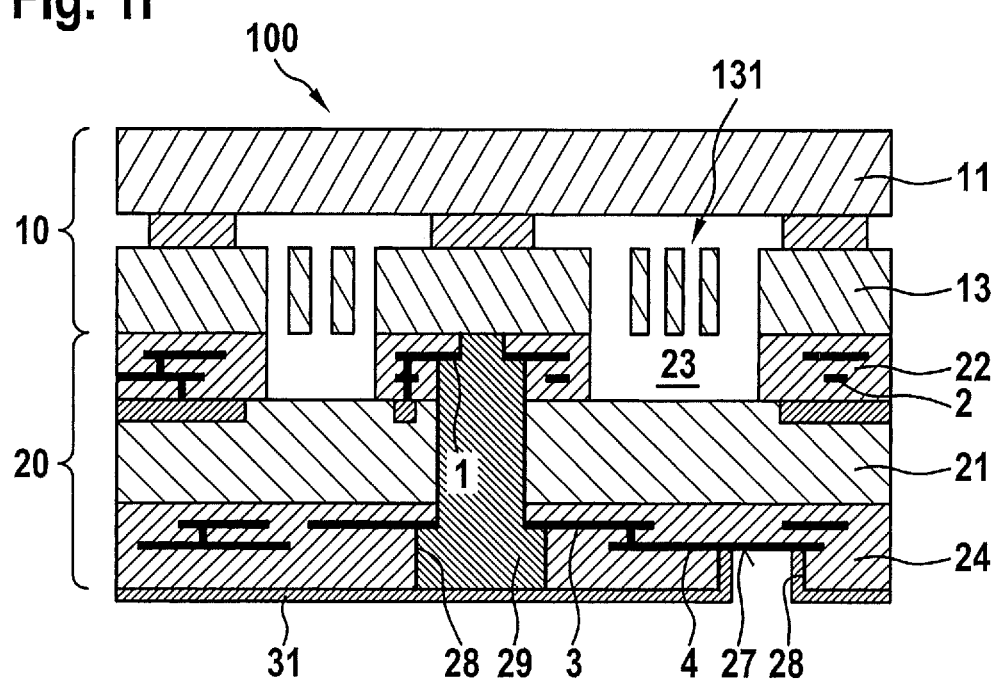

For example, silver, aluminum, gold, copper, or tungsten come into consideration as electrically conductive materials for filling through contact opening 25. Depending on the material, for example, an inkjet process, a dispensing process, or also a screen-printing process may be used for the filling. However, CVD processes, e.g., in the case of tungsten, electroplating processes, e.g., in the case of copper, or also classical deposition processes, such as sputtering and vapor deposition technology, also come into consideration. FIG. 1f shows the component structure after a planarization step, in the case of which the electrically conductive material deposited on the rear side of ASIC substrate 20 was removed, in order to expose rear-side insulating layer 24 again. Furthermore, an insulating layer 31 was deposited on the ASIC substrate rear side for the electrical insulation/passivation of ASIC through contact 29. Only bond pad area 27 was exposed. Insulating layer 31 may include one or more insulating layers, for example, made of silicon oxide, silicon nitride, silicon carbide, and/or aluminum oxide, in order to ensure low moisture absorption and/or a defined layer stress of insulating layer 31. Such an insulating layer prevents adjacent through contacts of a component from being short-circuited within the scope of the second level assembly or leakage currents from forming between adjacent through contacts due to moisture, for example. In addition, such an insulating layer also forms a mechanical protection for the corresponding component surface.

Alternatively to the above-described planarization step, the rear side of ASIC substrate 20 may also only be planarized enough that an electrically conductive layer remains on the ASIC rear side. This electrically conductive layer may then be structured using standard lithography and etching steps, in order to provide electrical terminal areas for the component.

In another method variant, the through contact openings are not completely filled with an electrically conductive material. Instead, only the wall of the through contact openings is coated with an electrically conductive material. In this case, the remaining volume of the through contact openings may be filled, for example, with a polymer, a silicon oxide, silicon nitride, a silicon oxynitride, a silicon carbide, or by combinations of these layers, which are deposited using known processes.

Figure 2:
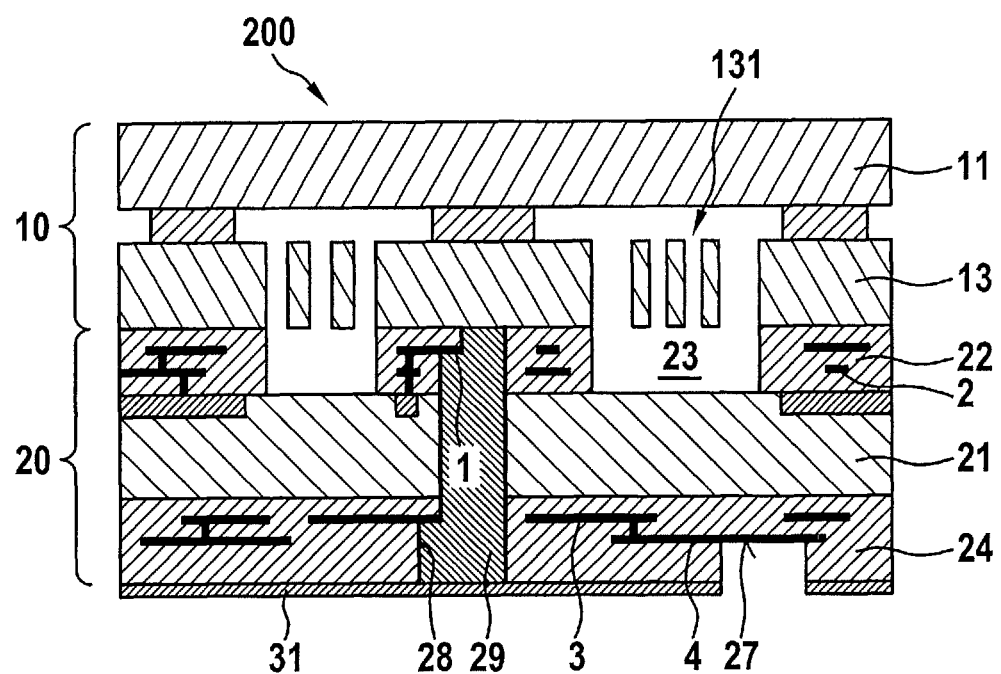
FIG. 2 shows a schematic sectional view through the structure according to the present invention of a second sensor component 200.

FIG. 2 shows a component 200 which only differs from component 100 shown in FIG. 1e in the geometry of ASIC through contacts 29. While the contact areas on metal layers 1 and 3 are conceived as ring contacts in the case of component 100, the contact areas on metal layers 1 and 3 in the case of component 200 only extend around a partial section of the through contact periphery, so that ASIC through contacts 29 are not symmetrical to their central axis here.

In the case of component 200, bond pad opening 27 was produced later, i.e., only after the manufacture of ASIC through contact 29 and the application of rear-side insulating layer 31. Therefore—in contrast to component 100—the side wall passivation of bond pad opening 27 is omitted here.

An advantageous refinement of the component structure described in conjunction with FIGS. 1a through 1f will be explained hereafter on the basis of FIGS. 3a through 3d. Since the processing of MEMS substrate 10 and ASIC substrate 20 and the connection of these two substrates 10 and 20 does not differ from the above-described method, reference is made in this regard to the explanations of FIGS. 1a and 1b. This also applies for the implementation of the layered structure on the rear side of ASIC substrate 20 and the manufacture of ASIC through contacts 29. Reference is made in this regard to the explanations of FIGS. 1c through 1f.

The starting point for the method variant shown in FIGS. 3a through 3d is the situation shown in FIG. 1e. Through contact opening 25 for the ASIC through contact was already produced and extends from the rear side of ASIC substrate 20 up to functional layer 13 of MEMS substrate 10. An electrical passivation 28 is located on the vertically oriented wall areas of through contact opening 25. The wall areas of through contact opening 25 which are oriented in parallel to the layer planes are exposed, in particular the contact areas on metal layers 1 and 3 and the surface of functional layer 13.

Figure 3A:
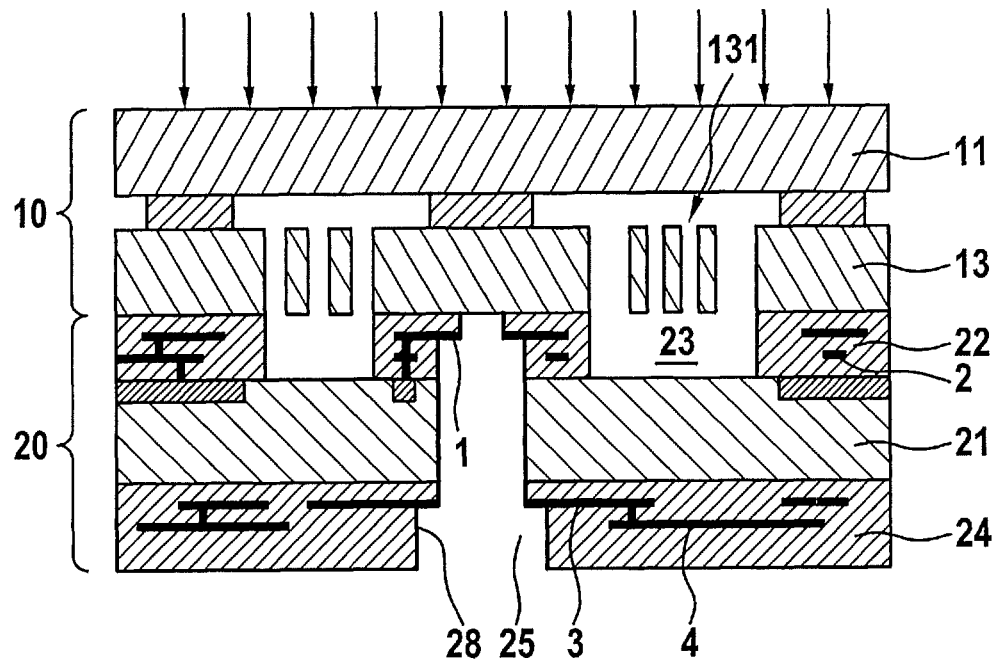
FIGS. 3a through 3d show a refinement of the contacting concept according to the present invention on the basis of schematic sectional views through the structure of a third sensor component 300 during the manufacture.

The arrows shown in FIG. 3a which are directed toward cap 11 illustrate that rear-side substrate 11 of MEMS substrate 10 is now also thinned here, for example, by chemical-mechanical polishing or plasma etching. As in the case of ASIC substrate 20, the remaining thickness of MEMS substrate 10 is also to be adapted to the type of the newer construction and connection technology and is to be selected in such a way that the mechanical stability of component 300 is ensured during its second level assembly.

Figure 3B:
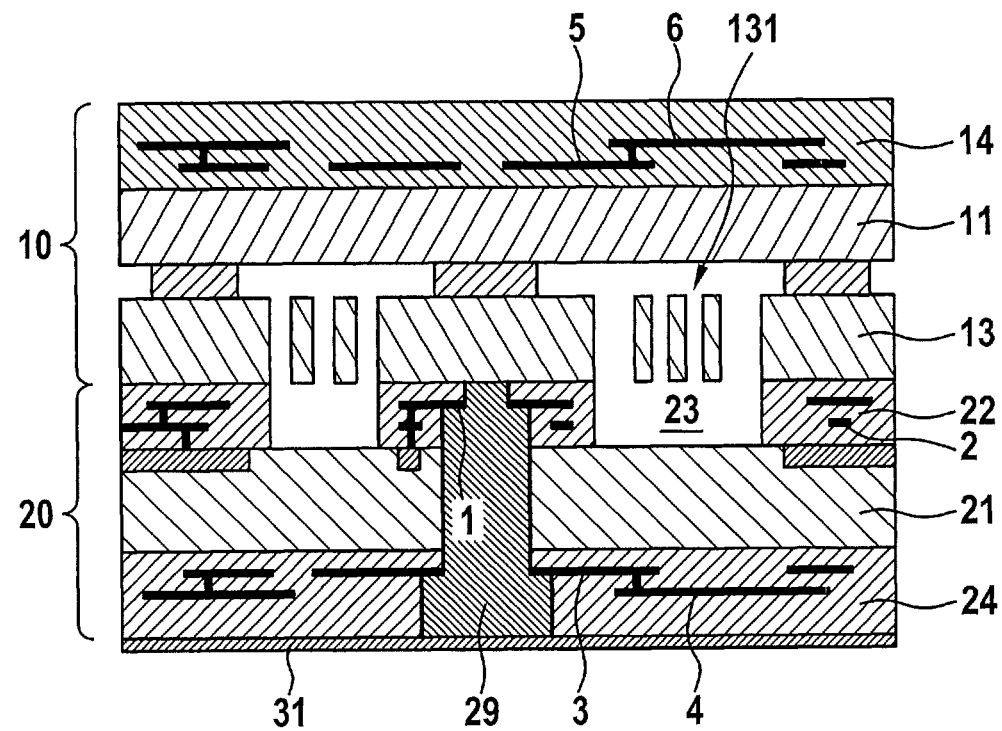

A layered structure having a multilayered metallization, which includes multiple structured metal layers 5, 6 embedded in an insulating layer 14, is now also produced on cap 11 thus thinned back. FIG. 3b illustrates that areas of structured metal layers 5, 6 are also interconnected via connecting lines in the case of the cap-side layered structure. In addition, through contact openings 25 in ASIC substrate 20 were temporarily filled with an electrically conductive material 29, as explained in conjunction with FIG. 1f. The rear side of ASIC substrate 20 was then also passivated with an insulating layer 31.

Figure 3C:
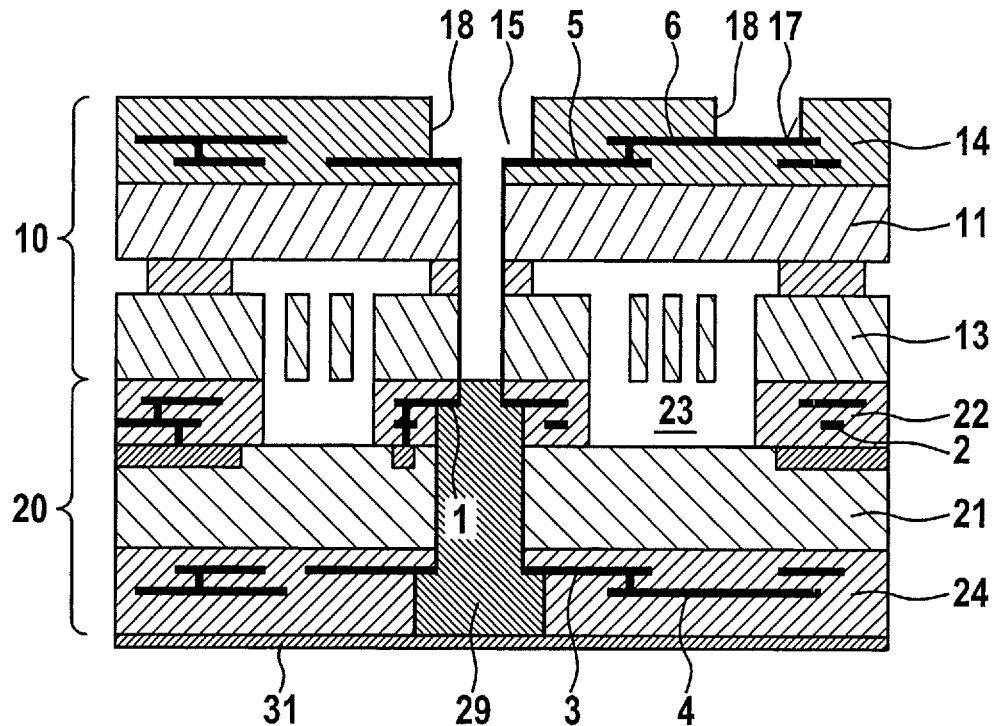

In a next method step, in addition to ASIC through contacts 29, MEMS through contacts for the external electrical contacting of component 300 are now also produced, which originate from the cap-side layered structure. For this purpose, through contact openings 15 are initially produced in MEMS substrate 10 using anisotropic etching processes. The position and opening cross section of these through contact openings 15 are defined with the aid of a masking (not shown here) of the cap-side layered structure and are selected here in such a way that at least illustrated through contact opening 15 is situated aligned with ASIC through contact 29. FIG. 3c illustrates that structured metal layer 5 also acts as an etch stop and thus protects the lower-lying layers of MEMS substrate 10 from an etching attack. The relative location, size, and geometry of the openings in the cap-side masking and in structured metal layers 5, 6 define the shape of through contact openings 15. Due to the offset between these openings, through contact opening 15 shown in FIG. 3c has a stepped shape which is symmetrical to its central axis. The areas of structured metal layers 5, which are used as the etch stop boundary or masking and are exposed after the structuring, form a ring-shaped contact area here. Through contact opening 15 extends in this exemplary embodiment over the entire thickness of MEMS substrate 10 up to ASIC through contact 29, which functions as an etch stop during the structuring of MEMS substrate 10.

Stepped through contact openings 15 may accordingly also be produced in MEMS substrate 10 or in the cap-side layered structure with the aid of a suitable and congruent layout of the cap-side masking and individual structured metal layers 5, 6 and with the aid of a suitable selection of the structuring processes.

Together with through contact opening 15, an access opening to uppermost circuit level 6 was also produced, which is also used in this case as an etch stop for the structuring process. The area of metal layer 6 thus exposed may be used as a bond pad area 17 for component 300. However, it is also conceivable to implement the access opening to uppermost circuit level 6 later in the manufacturing process, for example, after the filling or planarization of through contact opening 15.

FIG. 3c shows component 300 after an electric passivation layer 18 has been deposited on MEMS substrate 10 thus structured and, as explained in conjunction with FIG. 1e, has been structured, in order to expose the contact areas on structured metal layer 5 and on ASIC through contact 29.

MEMS through contact 19 finally results by filling of through contact opening 15 with an electrically conductive material. For example, the same electrically conductive material may be used here for this purpose as for ASIC through contact 29. Due to the stepped shape of through contact opening 15 and the exposed contact areas on circuit level 6, an electrical connection is established in this way between ASIC through contact 29, circuit level 5 of the cap-side layered structure, and the upper side of MEMS substrate 10. As a result, a coherent through contact 30 is obtained, which extends over the entire chip stack of component 300 and contacts selected circuit levels, as shown in FIG. 3d.

In the exemplary embodiment described here, an insulating layer 32 was also deposited on the upper side of the cap-side layered structure, for the electrical insulation or passivation of MEMS through contact 19/30. Insulating layer 32 may also include one or more insulating layers made of, for example, silicon oxide, silicon nitride, silicon oxynitride, silicon carbide, and/or aluminum oxide, in order to ensure low moisture absorption and/or defined layer stress of the insulating layer, for example.

Figure 3D:
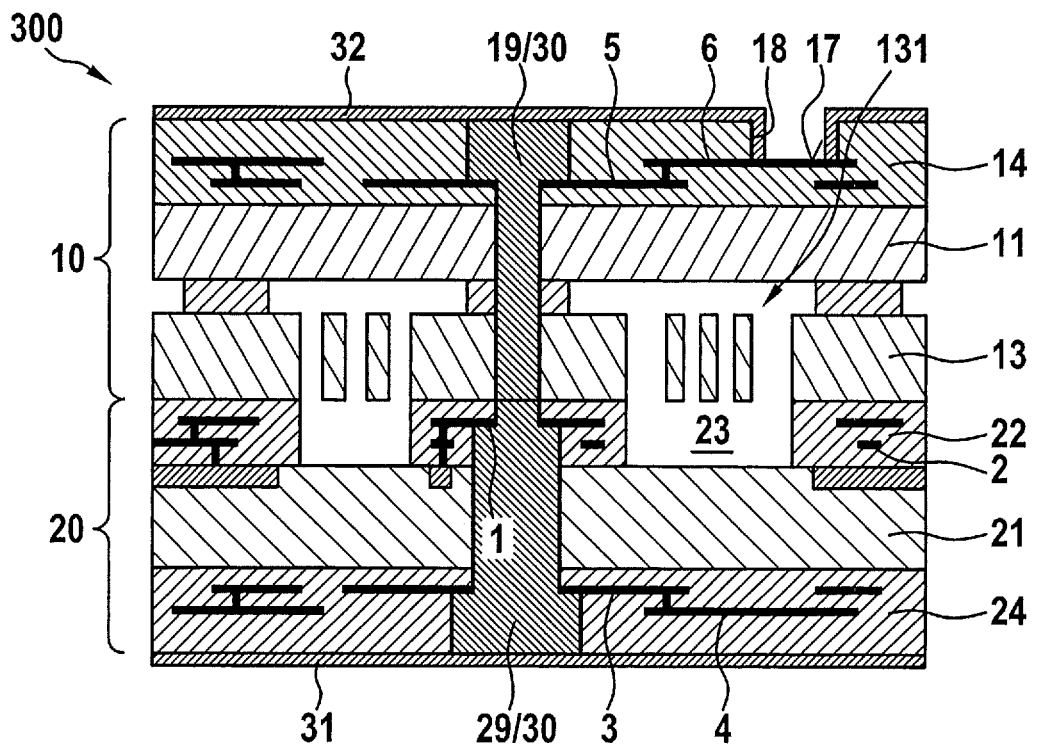

FIGS. 4 and 5 show component variants which only differ from component 300 shown in FIG. 3d in the extension of MEMS through contact 19 and/or ASIC through contact 29.

Thus, MEMS through contact 19 extends in the case of component 400—FIG. 4—only through the cap-side layered structure up to highly-doped functional layer 13. Functional layer 13 is contacted here, on the one hand, by ASIC through contact 29 and, on the other hand, by MEMS through contact 19.

In the case of component 500 shown in FIG. 5, MEMS through contact 19 even extends beyond MEMS substrate 10 up to uppermost circuit level 1 of ASIC substrate 20, while ASIC through contact 29 only extends up to circuit level 2 of ASIC substrate 20. Circuit levels 1 and 2 are electrically connected here with the aid of vias, so that electrical through contacting through the entire wafer stack is also possible in the case of component 500.

It is to be noted here that the MEMS and ASIC through contacts may stop both at the highly-doped functional layer of the MEMS substrate and also at one of the structured metal layers of the ASIC substrate or the MEMS substrate. The ASIC through contacts and the MEMS through contacts do not necessarily have to be situated aligned with one another and also do not necessarily have to be electrically connected.

Figure 6:
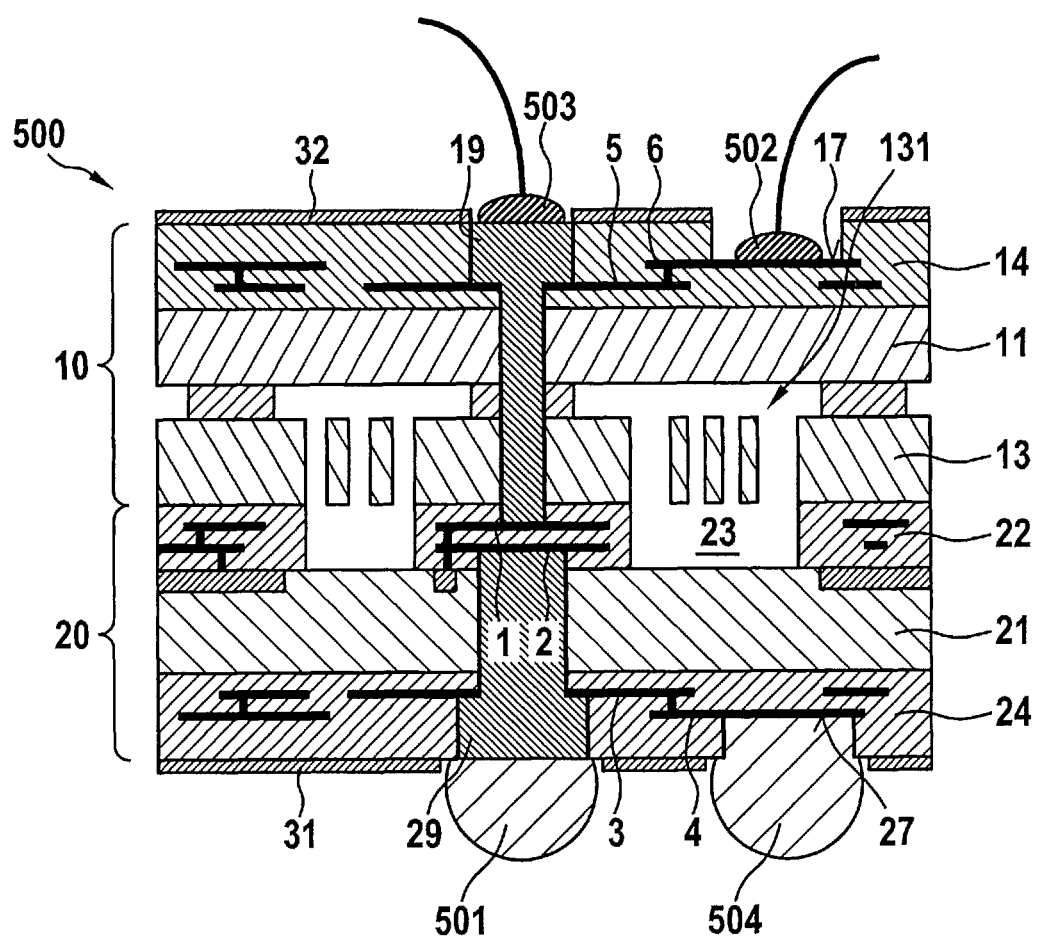

FIG. 6 shows various possibilities for the external contacting of a component according to the present invention on the basis of the example of component 500. Thus, component 500 may, for example, be mounted and electrically connected on a circuit board using flip-chip technology via solder bumps 501, 504. However, component 500 may also be electrically contacted via wire bonds 502, 503. Wire bonds 502 may be situated here on bond pads 17. The possibility is also shown of situating wire bonds 503 on through contact areas 19.

Component 500 could also be provided on the cap side with solder bumps, specifically in the area of MEMS through contact 19 and/or in bond pad areas 17, in order to install it using flip-chip technology on a circuit board. In this case, wire bonds would be provided in the area of ASIC through contact 29 and terminal pad 27.

In the above-described exemplary embodiments, the ASIC and MEMS through contacts are implemented in the form of openings in the particular substrate, which are completely filled with an electrically conductive material. It is also to be expressly noted once again here that the present invention also includes ASIC and MEMS through contacts, for the manufacture of which an electrically conductive coating is applied to the wall of a corresponding opening in the substrate, before it is completely filled with a polymer, for example.

What is claimed is:

1. A component, comprising:
   at least one MEMS element having a micromechanical structure;
   a cap for the micromechanical structure of the MEMS element; and
   at least one ASIC substrate;
   wherein:
      the micromechanical structure of the MEMS element is implemented in a functional layer of an SOI wafer functioning as the MEMS substrate;
      the MEMS element is mounted face down, with the structured functional layer on the ASIC substrate;
      the cap is implemented in the substrate of the SOI wafer;
      the ASIC substrate includes a starting substrate, which is provided with a layered structure on both sides, at least one circuit level being implemented in each case both in the MEMS-side layered structure and also in the rear-side layered structure of ASIC substrate; and
      in the ASIC substrate, at least one ASIC through contact is implemented which, originating from the rear side of the component, electrically contacts at least one of a circuit level of the rear-side layered structure and a circuit level of the MEMS-side layered structure.

2. The component as recited in claim 1, wherein:
   a cap-side layered structure having at least one circuit level is implemented on the MEMS element; and
   in the MEMS element, at least one MEMS through contact is implemented which, originating from the upper side of the component, electrically contacts at least one circuit level of the cap-side layered structure.

3. The component as recited in claim 2, wherein at least one of the ASIC through contact and the MEMS through contact extends up to the functional layer of the MEMS element.

4. The component as recited in claim 2, wherein at least one of the ASIC through contact and the MEMS through contact extends beyond the functional layer of the MEMS element.

5. The component as recited in claim 2, wherein the at least one ASIC through contact and the at least one MEMS through contact are situated aligned with one another and merge into one another to form a through contact for the entire component.

6. The component as recited in claim 2, wherein at least one of the ASIC through contact and the MEMS through contact has a stepped shape having step surfaces which each terminate with a selected circuit level of the component to provide a planar electrical contact between (i) the at least one of the ASIC through contact and the MEMS through contact and (ii) the selected circuit level.

7. The component as recited in claim 2, wherein:
   the component is an inertial sensor component;
   the micromechanical structure of the MEMS element includes at least one seismic mass and is equipped with a circuit arrangement for detecting deflections of the seismic mass;
   a standoff structure is implemented in the MEMS-side layered structure of the ASIC substrate; and
   at least parts of an evaluation circuit for sensor signals are integrated into at least one of the circuit level of the ASIC substrate and the circuit level of the MEMS element.

* * * * *